US006804685B2

(12) United States Patent
Besana et al.

(10) Patent No.: US 6,804,685 B2
(45) Date of Patent: Oct. 12, 2004

(54) VOICE MESSAGE MANAGING METHOD, IN PARTICULAR FOR A VOICE DATA RECORDING/PLAYING/EDITING ELECTRONIC DEVICE

(75) Inventors: Monica Besana, Milan (IT); Loris Navoni, Cernusco Sul Naviglio (IT); Michele Borgatti, Finale Emilia (IT); Pierluigi Rolandi, Monleale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 88 days.

(21) Appl. No.: 09/860,832

(22) Filed: May 17, 2001

(65) Prior Publication Data

US 2002/0007277 A1 Jan. 17, 2002

(30) Foreign Application Priority Data

May 18, 2000 (EP) ............................................. 00830359

(51) Int. Cl.[7] ............................................. G06F 17/30
(52) U.S. Cl. .................................... 707/104.1; 707/100
(58) Field of Search ........................... 379/88.22, 88.28, 379/67.1; 711/173, 155, 156, 103; 365/185.33, 185.11; 704/270; 707/200, 104.1, 202; 709/231, 204

(56) References Cited

U.S. PATENT DOCUMENTS

| | | | | |
|---|---|---|---|---|
| 5,544,119 A | * | 8/1996 | Wells et al. ............ 365/185.11 |
| 5,787,445 A | | 7/1998 | Daberko ..................... 707/205 |
| 5,812,773 A | * | 9/1998 | Norin ......................... 709/204 |
| 5,842,170 A | | 11/1998 | Daberko ..................... 704/278 |
| 6,092,082 A | * | 7/2000 | Maruyama .................. 707/200 |
| 6,161,163 A | * | 12/2000 | Komatsu et al. ............ 711/103 |
| 6,260,103 B1 | * | 7/2001 | Alexis et al. ................ 711/103 |
| 6,269,434 B1 | * | 7/2001 | Tanaka ....................... 707/200 |
| 6,385,690 B1 | * | 5/2002 | Iida et al. ................... 707/205 |
| 6,483,901 B1 | * | 11/2002 | Cuallo ..................... 379/88.28 |

FOREIGN PATENT DOCUMENTS

| EP | 0 867 884 A2 | 9/1998 |
|---|---|---|
| EP | 0 984 455 A1 | 3/2000 |

OTHER PUBLICATIONS

Koemmerer, S., "Answering Machine Solution," *Philips Dect Cordless Telephone, ONIS 6411*, TMBDU Grenoble Application Laboratory, Jan. 27, 1999, pp. 1–14.

* cited by examiner

*Primary Examiner*—Diane D. Mizrahi
*Assistant Examiner*—Apu M Mofiz
(74) *Attorney, Agent, or Firm*—Lisa K. Jorgenson; Robert Iannucci; Seed IP Law Group PLLC

(57) ABSTRACT

The voice message managing method for a voice data recording/playing/editing electronic device, said electronic device including a memory device having a first memory area and a second memory area, includes the steps of memorizing, in the first memory area, a plurality of voice messages, and of memorizing, in the second memory area, information regarding the plurality of voice messages. The method also includes the steps of organizing the first memory area as a sequence of blocks, and of memorizing in each block a portion of voice message. The method moreover comprises the steps of defining a list (FBL) containing information on the status of the blocks and memorizing the list in a first memory sub-area of the second memory area, and of defining a table containing a plurality of first vectors associated to respective voice messages and memorizing this table in a second memory sub-area of the second memory area.

21 Claims, 7 Drawing Sheets

VOICE MESSAGE MANAGING METHOD, IN PARTICULAR FOR A VOICE DATA RECORDING/PLAYING/EDITING ELECTRONIC DEVICE

TECHNICAL FIELD

The present invention regards a voice message managing method, in particular for a voice data recording/playing/editing electronic device.

BACKGROUND OF THE INVENTION

As is known, electronic devices are available on the market for the recording/playing/editing of voice data, such as telephone automatic intercepts present also in cell phones or DECTs, portable voice recorders, and the like, which use solid-state memory devices, for example of the flash EEPROM type, to store voice messages coming from a user.

The advantages that may be obtained from using these solid-state memory devices rather than magnetic tapes inside electronic devices for the recording/playing/editing of voice data are described in the U.S. Pat. No. 5,842,170, with particular reference to the possibility of modifying a voice message previously recorded inside the solid-state memory device by simply erasing a part of the voice message itself or by entering therein a new voice message. The U.S. Pat. No. 5,842,170, however, does not provide any teaching on how to manage the voice messages inside an electronic device for the recording/playing/editing of voice data.

In this connection, a possibility for managing voice messages of a known type consists in memorizing voice segments, corresponding to portions of a voice message to be memorized, in memory locations contained inside the solid-state memory device. Each voice segment is associated to a respective pointer which is contained inside the voice segment itself (for example as header), and the set of pointers determines the structure of the voice messages.

The above solution is not very efficient and flexible as regards implementation of the functions of partial editing and erasing of voice messages, in so far as the information for management of the latter is contained inside the voice messages themselves.

SUMMARY OF THE INVENTION

An embodiment of the present invention provides a voice message managing method for a voice data recording/playing/editing electronic device that overcomes the limitations and drawbacks described above with reference to the known art.

BRIEF DESCRIPTION OF THE DRAWINGS

The characteristics and advantages of the method according to the invention will emerge clearly from the ensuing description of an example of embodiment, which is given simply to provide a non-limiting illustration, with reference to the attached drawings.

In said drawings.

DETAILED DESCRIPTION OF THE INVENTION

Figure 1:
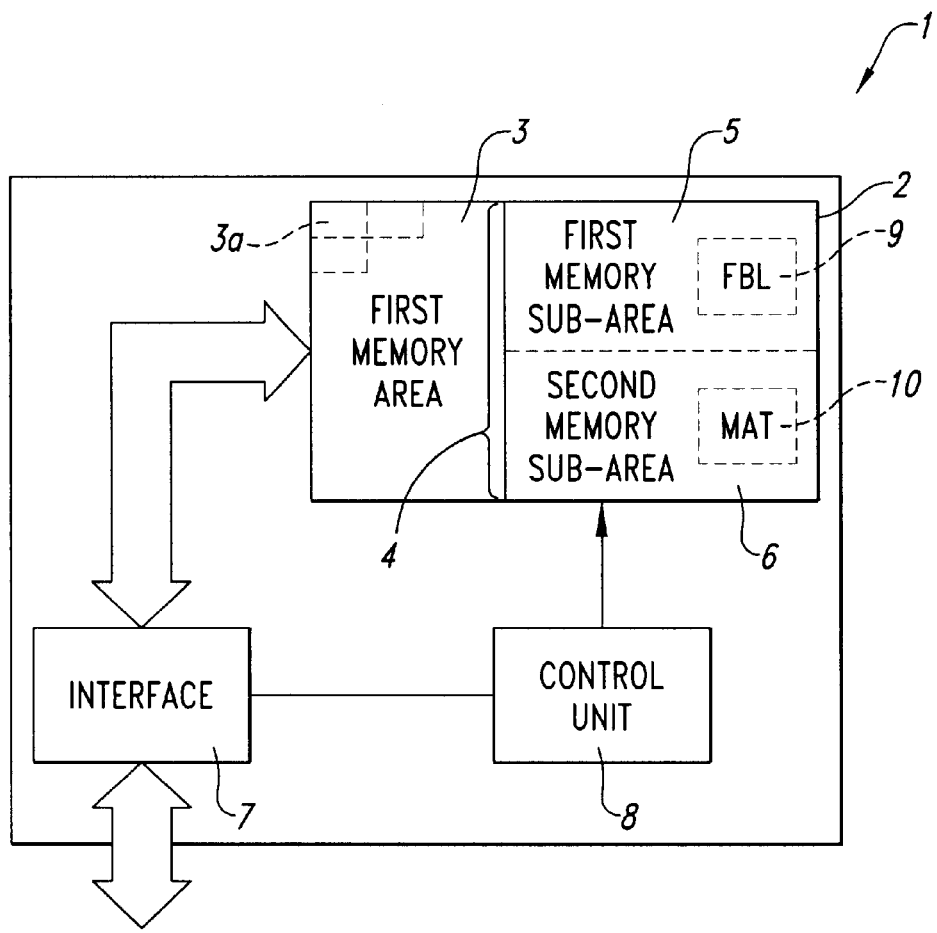
FIG. 1 is a schematic representation of an electronic device for the recording/playing/editing of voice data.

FIG. 1 is a schematic representation of an electronic device 1 for the recording/playing/editing of voice data, which incorporates a memory device 2 made, for example, by means of a flash EEPROM memory divided into random-access sectors. The electronic device 1 moreover comprises at least one interface 7, connected between the memory device 2 and the outside, and a control unit 8, for example a microprocessor or a microcontroller, which controls the memory device 2 and the interface 7.

In detail, the memory device 2 is divided into two memory areas 3, 4. The first memory area 3 is made up of a plurality of memory locations, logically organized as a sequence of blocks 3a which have a pre-set size (for example, 1 KB) and contain voice messages coming from a user. In particular, in each block 3a is memorized a portion of a voice message in the form of a plurality of voice data digitized and appropriately compressed by means of the control unit 8. Memorizing of the voice messages inside the first memory area 3 may also be non-sequential, i.e., the blocks 3a in which a voice message is memorized do not necessarily have to be contiguous, and is managed by the control unit 8.

The second memory area 4 of the memory device 2 comprises a first sub-area 5 and a second sub-area 6. In particular, in the first sub-area 5 of the memory device 2 is memorized a Free-Block List (FBL) 9 of the blocks 3a that are free in the first memory area 3, whilst in the second sub-area 6 of the memory device 2 is memorized a memory-allocation table MAT (Message-Allocation Table) 10, containing information characterizing the individual voice messages, such as the level of compression used during recording of the voice message or the sequence of blocks 3a in which the voice message that is to be heard, erased or edited is contained.

In greater detail, in the list FBL 9 the status of each block 3a contained in the first memory area 3 of the memory device 2 is identified using a status code made up of two bits. In particular, the status of block 3a being free is identified by the status code '00,' the status of block 3a containing digitized voice data (block 3a written) is identified by the status code '10,' the status of block 3a containing digitized voice data that are no longer utilizable (block 3a to be erased) is identified by the status code '11,' and the status of block 3a not utilizable, i.e., which presents an incorrect operation, is identified by the status code '01.' The identification of the blocks 3a that are not utilizable takes place during the initialization phase of the memory device 2.

This type of coding avoids erasing and re-writing of the second memory area 4 at each modification of the status of the individual blocks 3a and enables repeated updating of the list FBL by appropriately incrementing one of the bits of the status codes. In this way, it is possible to postpone erasing and re-writing of the second memory area 4 only in the presence of pre-set conditions. In greater detail, if a cycle of use of a single block 3a is considered, initially the block 3a is free, and hence is represented by the status code '00.' When digitized voice data belonging to a message to be memorized are memorized in the block 3a, the latter assumes the written block status, identified by the status code '10,' which is obtained from the status code '00' by simply incrementing the first of the two bits '00' of one unit. When the digitized voice data contained in the block 3a are to be erased, the block 3a assumes the status of a block to be erased, identified by the status code '11,' which is obtained from the status code '10' by simply incrementing the second of the two bits '10' of one unit. The actual erasing of the second memory area 4 of the memory device 2 is performed only when the erasing of the memory sector in which the block 3a to be erased is contained is carried out, i.e., when the block 3a is to be brought back from the status of block to be erased (status code '11') to the status of block free (status code '00'). All the other updates of the list FBL, instead, do not require any erasing of the second memory area 4 of the memory device 2.

The table MAT is made up of a plurality of main vectors called HEAD_MSG and a plurality of secondary vectors called NEXT_INFO. Each main vector HEAD_MSG comprises a plurality of successive fields that store information characterizing a single voice message and information on the first sequence of contiguous blocks 3a in which the voice message is memorized. More in particular, a first field (named "flag_type") of each main vector HEAD_MSG contains an identification datum for identifying the type of vector; a second field (named "msg_id") contains an identification datum for identifying the voice message to be memorized (for example, a number or a label); a third field (named "msg_type") contains an identification datum for identifying the category to which the voice message itself belongs (for example, whether the voice message is a telephone number or an instruction regarding an action to be performed, i.e., a so-called "to do" message); a fourth field of each main vector HEAD_MSG (named "comp_type") contains an identification datum of the compression type used for the digitized voice data forming the voice message to be memorized; a fifth field (named "msg_desc") contains other information characterizing the voice message itself (for example, date and time at which the voice message was recorded); a sixth field (named "start_add") of each main vector HEAD_MSG contains an address of the memory location in which the first sequence of contiguous blocks 3a containing the voice message to be memorized starts; and a seventh field (named "end_add") of each main vector HEAD_MSG contains an address of the memory location in which this first sequence of contiguous blocks 3a terminates.

Each secondary vector NEXT_INFO comprises a plurality of successive fields in which information is memorized on the sequences of contiguous blocks 3a containing successive portions of the message to be memorized. More in particular, a first field (named "flag_type") of each secondary vector NEXT_INFO contains an identification datum for identifying the type of vector; a second field (named "start_add") contains an address of the memory location in which the nth sequence of contiguous blocks 3a containing the voice message to be memorized starts; and a third field (named "end_add") of each secondary vector NEXT_INFO contains an address of the memory location in which this nth sequence of contiguous blocks 3a terminates.

From what has been described above it may inferred that, in the table MAT, each voice message is identified by a single main vector HEAD_MSQ followed, if required, by one or more secondary vectors NEXT_INFO set sequentially. Obviously, if the voice message to be memorized is memorized in a single sequence of contiguous blocks 3a, the voice message is identified by a single main vector HEAD_MSG.

The table MAT is of the incremental type, as is the list FBL. In fact, from the standpoint of management of the table MAT, the erasing of a voice message corresponds simply to adding an identification value (for instance, a "1") to the first field of the main vector HEAD_MSG associated to the voice message that is to be erased. In this way, the voice message is recognized as a message to be erased without having to resort to erasing of the second memory area 4 of the memory device 2.

The voice message managing method according to the invention will now be described with reference to the flowcharts shown in FIGS. 2–7.

Figure 2:
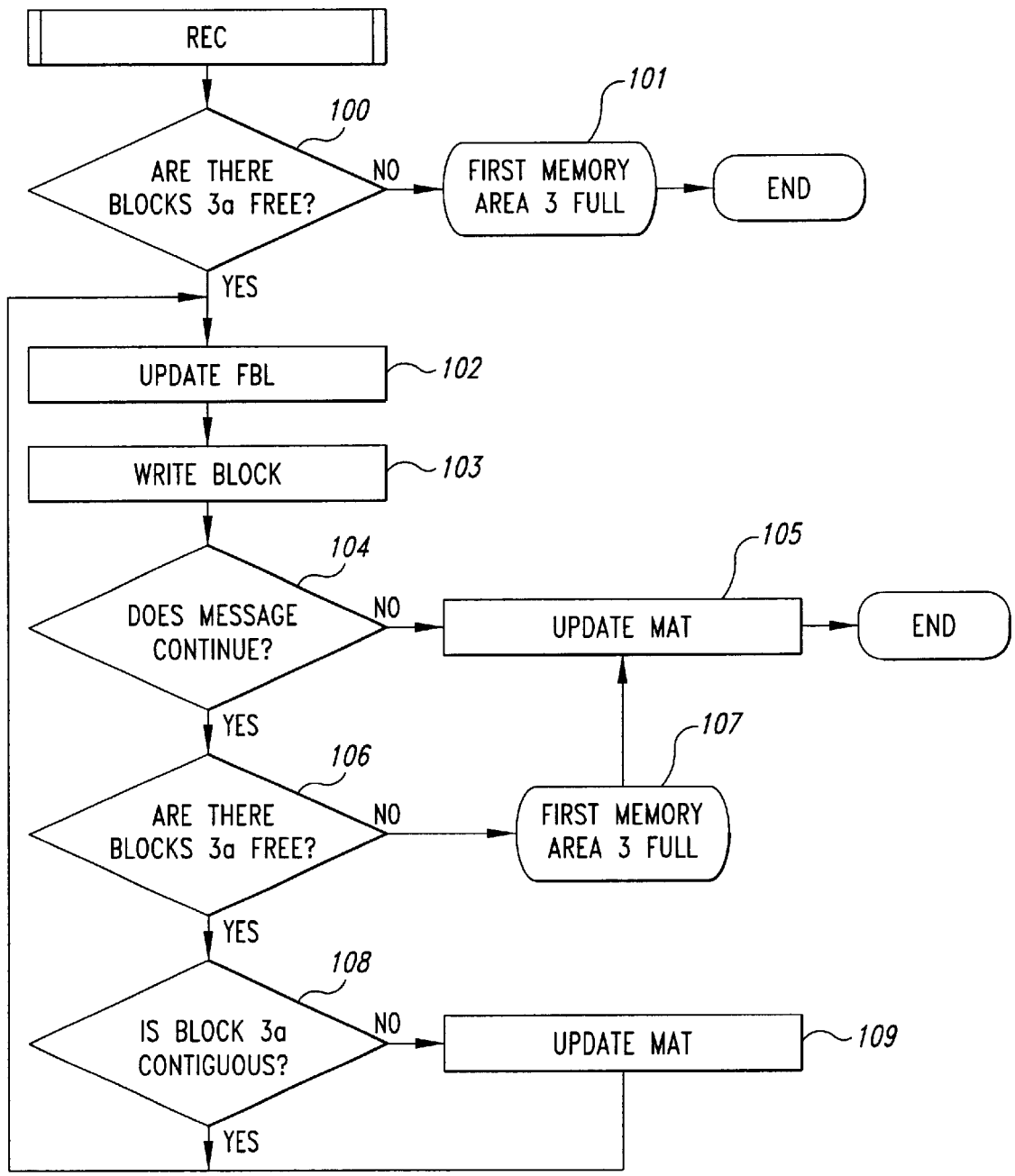
FIGS. 2–7 present flowcharts regarding a voice message managing method according to an embodiment of the invention.

In detail, the flowchart shown in FIG. 2 represents a recording algorithm REC for recording voice messages, which is executed by the control unit 8. Initially, the recording algorithm REC verifies whether, in the first memory area 3 of the memory device 2, there are blocks 3a free in which the voice message to be recorded can be memorized. This information may be obtained by consulting the list FBL (block 100). In the event of there not being blocks 3a free in the first memory area 3 (output NO of block 100), the recording algorithm REC terminates since the first memory area 3 is fill (block 101). Instead, in the case where there is at least one block 3a free (output YES of block 100) in the first memory area 3, the recording algorithm REC updates the list FBL by entering the status code '10,' identifying a written block, in the position identifying the free block 3a in the list FBL (block 102), and stores a first portion of the voice message to be recorded in this block (block 103). At this point, the recording algorithm REC verifies whether the voice message to be recorded continues or not (block 104). If the voice message does not continue (output NO of block 104), the recording algorithm REC appropriately updates the table MAT (block 105), and then terminates. On the other hand, if the voice message to be recorded continues (output YES of block 104), the recording algorithm REC verifies whether, in the first memory area 3 of the memory device 2, there are further blocks 3a free in which to store the subsequent portions of the voice message to be recorded. This information may be obtained by consulting the list FBL (block 106). In the event of there not being blocks 3a free in the first memory area 3 (output NO of block 106), the recording algorithm REC terminates since the first memory area 3 is full (block 107). Also in this case, before terminating, the registration algorithm REC updates the table MAT (block 105). In the case, instead, in which there is at least one block 3a free (output YES of block 106) in the first memory area 3, the registration algorithm REC verifies whether this free block 3a is contiguous to the block 3a that contains the first portion of the voice message to be recorded (block 108). If the free block 3a is not contiguous (output NO of block 108), the registration algorithm REC updates the table MAT by adding a secondary vector NEXT_INFO (block 109). Then the algorithm proceeds in the way described above, returning to the output YES of block 100. If, instead, the free block 3a is contiguous (output YES of block 108), the registration algorithm REC returns to the output YES of block 100 without updating the table MAT.

Figure 3:
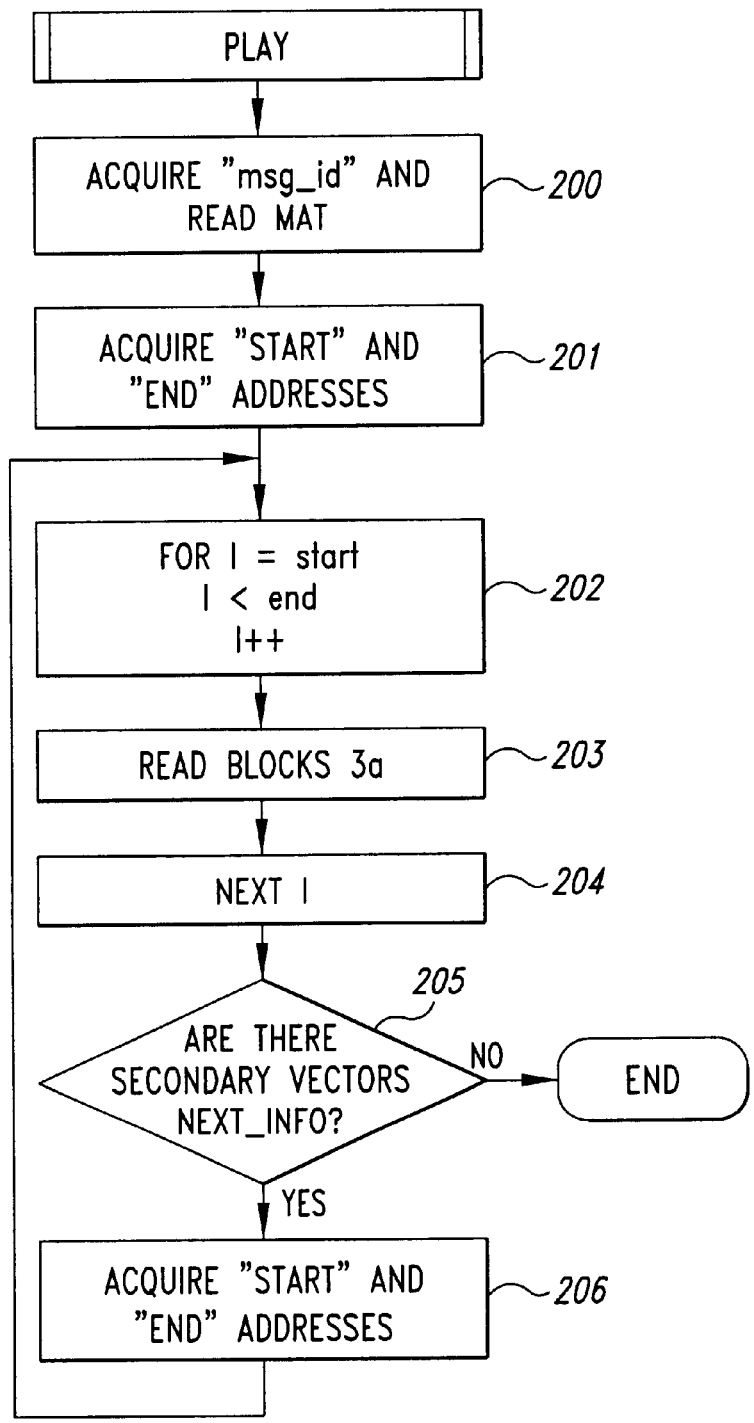

The flowchart shown in FIG. 3 represents a playing algorithm PLAY of voice messages executed by the control unit 8. Initially, the playing algorithm PLAY acquires, from the interface 7, the identification datum ("msg_jd") of the voice message to be played; then it uses this datum to access, in the table MAT, the main vector HEAD_MSG associated to the voice message to be played (block 200). The playing algorithm PLAY then acquires, from the sixth field of the main vector HEAD_MSG associated to the voice message to be played, the address ("start") of the memory location in which the first sequence of contiguous blocks 3a containing the voice message starts. The playing algorithm PLAY moreover acquires, from the seventh field of the main vector HEAD_MSG, the address ("end") of the memory location in which this first sequence of contiguous blocks 3a terminates (block 201).

Subsequently, the playing algorithm PLAY plays the voice message, one block 3a after another, up to the end of the first sequence of contiguous blocks 3a (blocks 202, 203, 204). Then, the playing algorithm PLAY reads the table MAT to verify whether one or more secondary vectors NEXT_INFO associated to the voice message to be played are present or not (block 205). If the algorithm finds a new main vector HEAD_MSG, this means that the message to be played has been completely played, and so the algorithm terminates (output NO of block 205). If, instead, the playing algorithm PLAY finds at least one secondary vector NEXT_INFO associated to the voice message to be played, this means that the latter has not been recorded in a single sequence of contiguous blocks 3a. Consequently, in order to terminate the playing of the voice message, the algorithm must play at least one second sequence of contiguous blocks 3a (output YES of block 205) by acquiring, from the second field of the secondary vector NEXT_INFO, the address of the memory location in which this second sequence of contiguous blocks 3a starts, and, from the third field of the secondary vector NEXT_INFO, the address of the memory location in which this second sequence of contiguous blocks 3a ends (block 206). The playing algorithm PLAY then proceeds in the way described above, returning to the input of block 202 until it terminates when it encounters a new main vector HEAD_MSG.

Figure 4:
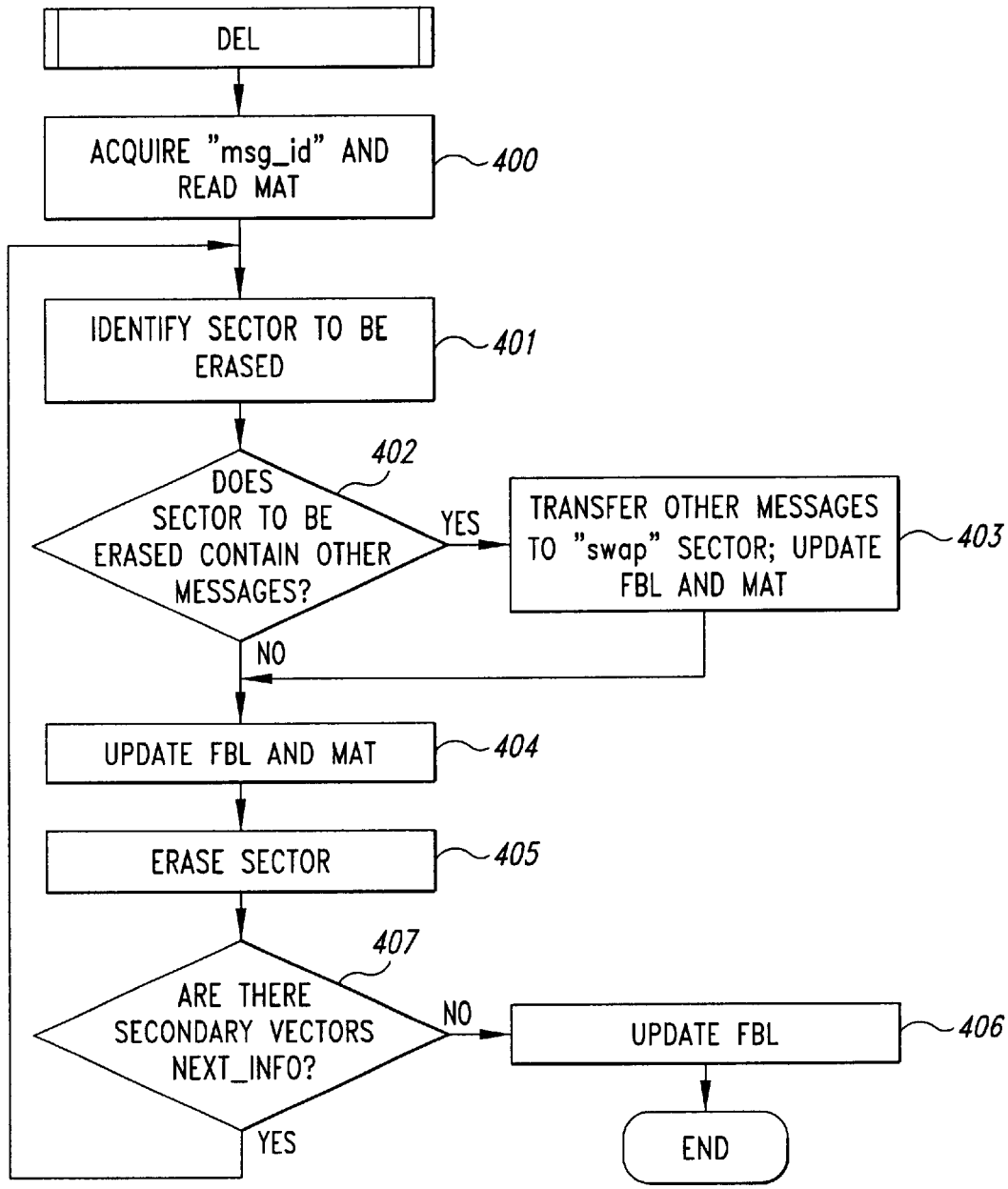

The flowchart shown in FIG. 4 represents an erasing algorithm DEL for deleting voice messages, which is executed by the control unit 8. Before describing the erasing algorithm DEL, it should be pointed out that the minimum unit erasable inside the memory device 2 corresponds to one memory sector. This said, the erasing algorithm DEL initially acquires, from the interface 7, the identification datum ("msg_id") for identifying the voice message to be erased; then it uses this datum to access, in the table MAT, the main vector HEAD_MSG associated to the voice message to be erased (block 400). Next, the erasing algorithm DEL identifies the sector of the first memory area 3 that contains the voice message to be erased (sector to be erased) (block 401). In addition, the erasing algorithm DEL determines whether, in the sector to be erased, there are present also other voice messages (not to be erased) (block 402).

If no further messages are present in the sector to be erased (output NO of block 401), the erasing algorithm DEL proceeds as will be described later on. If, instead, also other messages are present in the sector to be erased (output YES of block 401), the erasing algorithm DEL shifts these messages into a sector reserved for this purpose (referred to as "swap" sector). Shifting of these messages is carried out, one block 3a at a time, and initially requires updating of the list FBL (by entering the status code '11' in the positions corresponding to the blocks 3a to be shifted) and finally updating of the table MAT (block 403). The erasing algorithm DEL then proceeds to updating the list FBL by entering the status code '11' in the positions corresponding to the blocks 3a containing the voice message to be erased, and to updating the table MAT by invalidating the main vector HEAD_MSG associated to the voice message to be erased (block 404). In this way, consistency of the list FBL and the table MAT is maintained with the content of the first memory area 3 of the memory device 2 in the case where the electronic device 1 were to turn off abruptly.

At this point, the erasing algorithm DEL erases the sector containing the voice message to be erased, which will become the new "swap" sector (block 405).

If the voice message to be erased has not been memorized in a single sequence of contiguous blocks 3a, it may happen that successive portions of the voice message to be erased are not found in one and the same sector, but in different sectors. This involves erasing of other sectors by the erasing algorithm DEL. In order to determine whether the voice message to be erased is memorized in more than one sector, the erasing algorithm DEL verifies whether, in addition to the main vector HEAD_MSG, one or more secondary vectors NEXT_INFO are present (block 406). If no secondary vectors NEXT_INFO are present (output NO of block 407), the erasing algorithm DEL terminates. If, instead, one or more secondary vectors NEXT_INFO are present, the erasing algorithm DEL proceeds in the way described above, returning to the input of block 401 until it terminates when it encounters a new main vector HEAD_MSG.

In both cases, before terminating, the erasing algorithm DEL updates the list FBL again (block 406). It should be pointed out that this latter updating of the LIST FBL is different from the previous ones. In fact, it requires that the status code '00' be written in the positions associated to the blocks 3a belonging to the sector that has been erased. In this case, then, it is no longer possible to use the incremental-writing approach described previously. The erasing algorithm DEL proceeds then by memorizing the updated list FBL in a memory sector available inside the second memory area 4. An identification bit ("flag") at the start of this sector signals that the updated list FBL is contained therein. At the end of updating, this sector is erased so as to make it available again in the memory.

Figure 5:
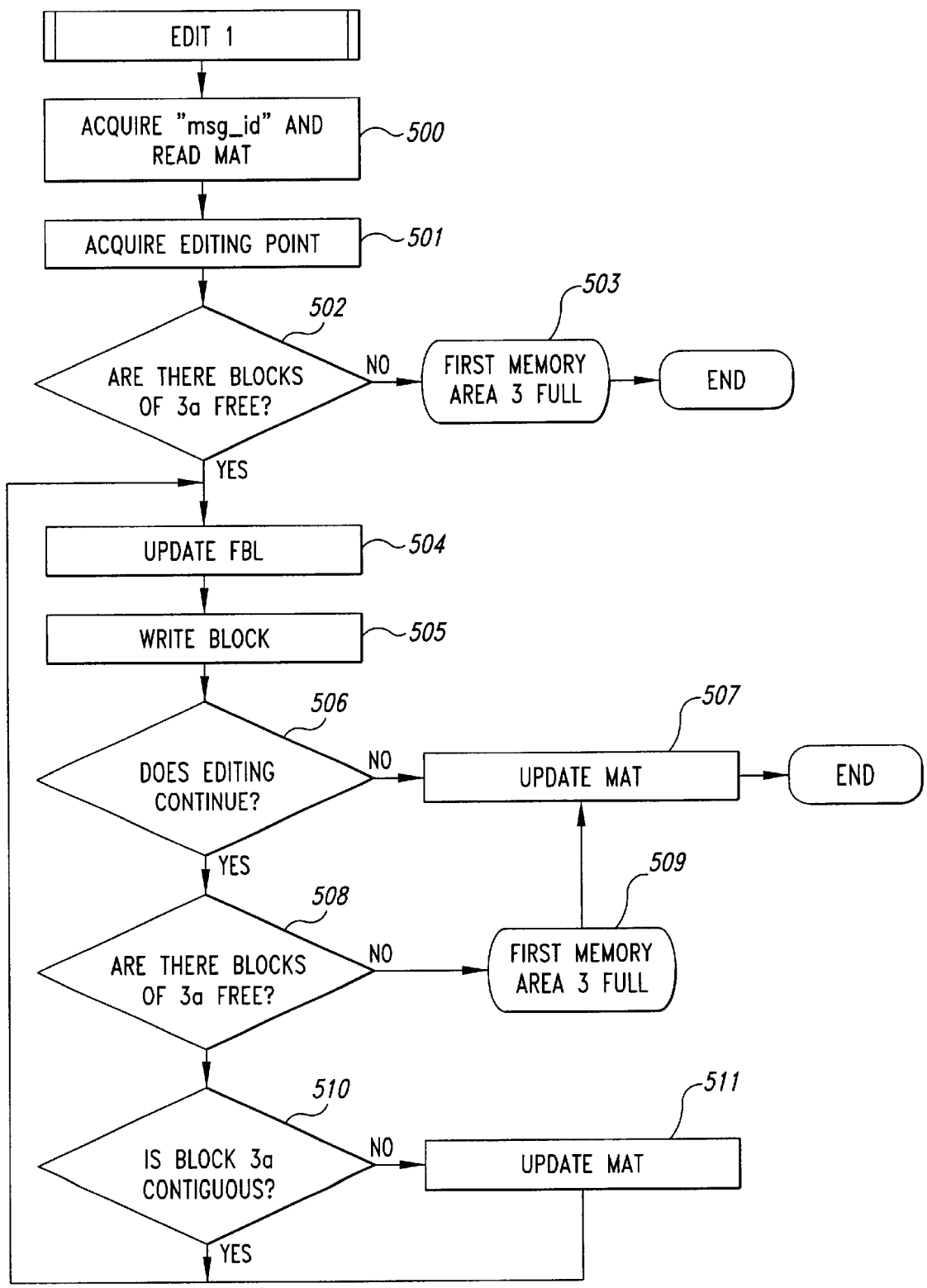

The flowchart shown in FIG. 5 represents a first editing algorithm EDIT1 for editing voice messages, which is executed by the control unit 8. The first editing algorithm EDIT1 makes it possible to modify a voice message previously recorded by entering a new voice message therein. Initially, the first editing algorithm EDIT1 acquires both the identification datum ("msg_id") identifying the voice message that is to be modified (block 500) and the point (editing point) of the voice message to be modified in which the new voice message is to be entered (block 501). In this way, in fact, the table MAT can be updated in such a way that the modified message appears as a single message.

The first editing algorithm EDIT1 then proceeds by verifying whether, in the first memory area 3 of the memory device 2, there are free blocks 3a where the new voice message can be memorized. This information can be obtained by consulting the list FBL (block 502). In the event of there not being any free blocks 3a in the first memory area 3 (output NO of block 502), the first editing algorithm EDIT1 terminates since the first memory area 3 is full (block 503). Instead, in the case where there is at least one block 3a free in the first memory area 3 (output YES of block 502), the first editing algorithm EDIT1 updates the list FBL by entering the status code '10,' identifying a written block, in the position identifying the free block 3a (block 504) and stores a first portion of the new voice message in this block (block 505). At this point, the first editing algorithm EDIT1 verifies whether the new voice message continues or not (block 506). If the new voice message does not continue (output NO of block 506), the first editing algorithm EDIT1 accordingly updates the table MAT (block 507) and then terminates. If, instead, the new message continues (output YES of block 506), the first editing algorithm EDIT1 verifies whether, in the first memory area 3 of the memory device 2, there are further blocks 3a free in which subsequent portions of the new voice message can be memorized; this information may be obtained by consulting the list FBL (block 508).

In the event of there not being any blocks 3a free in the first memory area 3 (output NO of block 508), the first editing algorithm EDIT1 terminates since the first memory area 3 is full (block 509). Also in this case, before terminating, the first editing algorithm EDIT1 updates the table MAT (block 507). On the other hand, in the case where there is at least one free block 3a present in the first memory area 3 (output YES of block 508), the first editing algorithm EDIT1 verifies whether this free block 3a is contiguous to the block 3a that contains the first portion of the new voice message (block 510). If the block 3a that is free is not contiguous (output NO of block 510), the first editing algorithm EDIT1 updates the table MAT by adding a secondary vector NEXT_INFO (block 511). The algorithm then proceeds as described above, returning to the output YES of block 502. If, instead, the block 3a that is free is contiguous (output YES of block 510), the first editing algorithm EDIT1 returns to the output YES of block 502 without updating the table MAT.

Figure 6:
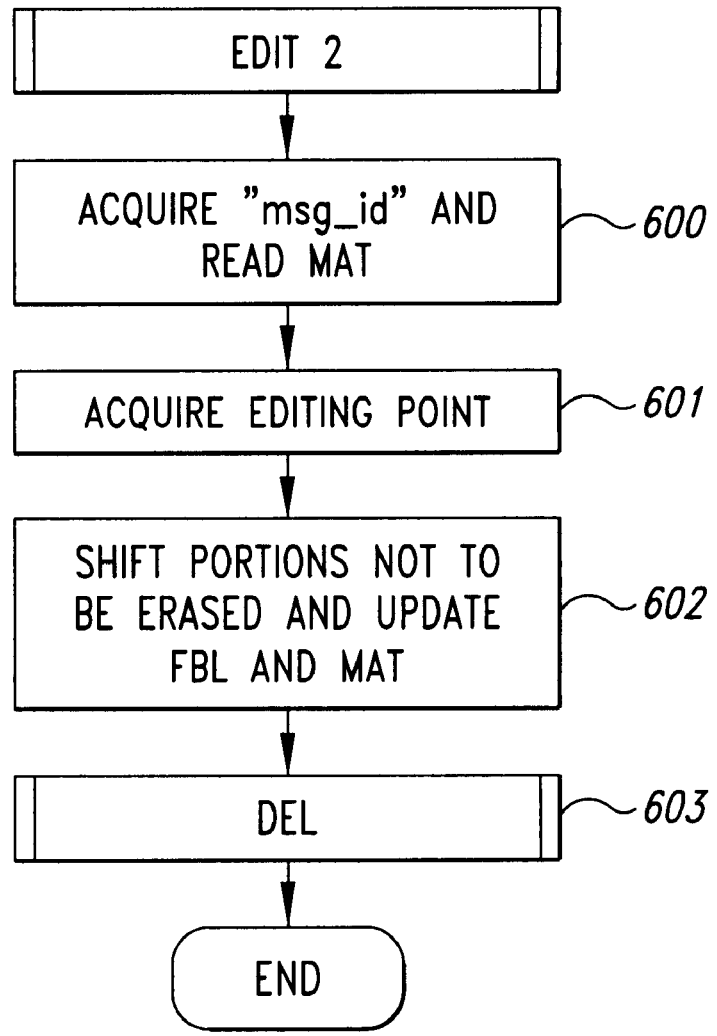
Figure 7:
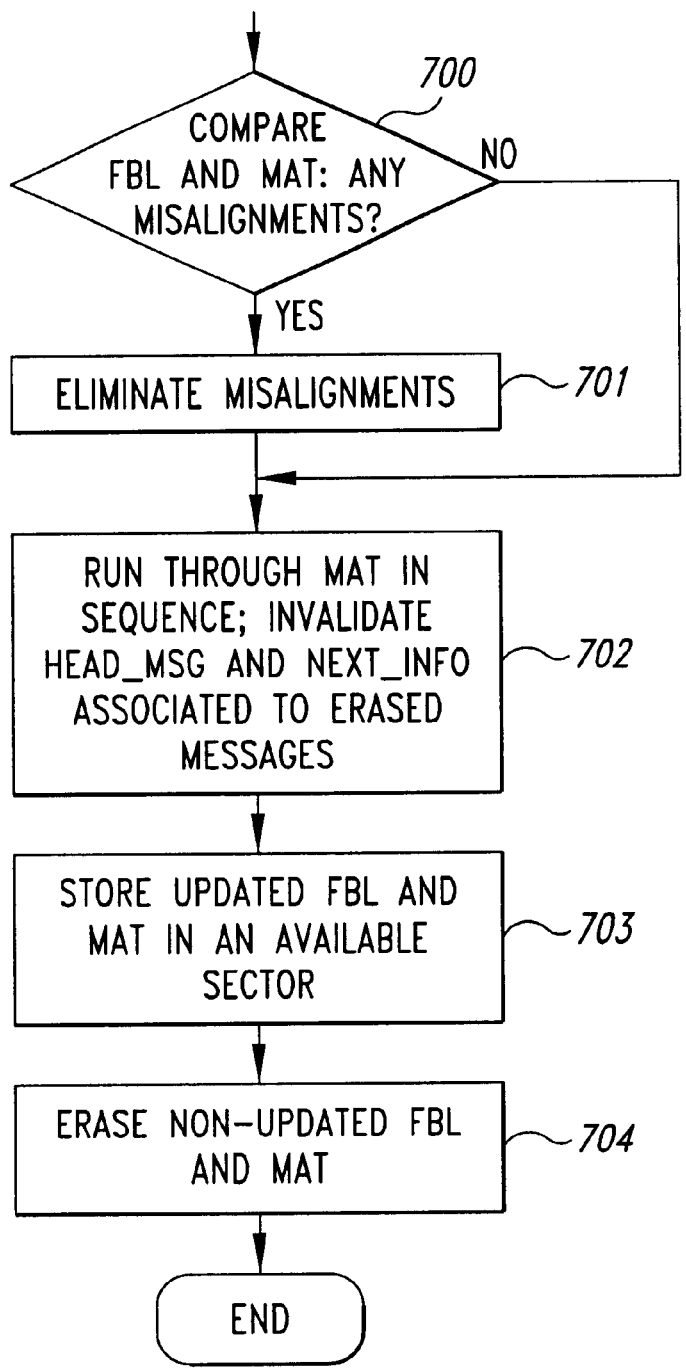

The flowchart shown in FIG. 6 represents a second editing algorithm EDIT2 executed by the control unit 8 and used in the case where the user wishes to erase a portion of a voice message previously recorded. Initially, the second editing algorithm EDIT2 acquires both the identification datum ("msg_id") identifying the voice message that is to be modified (block 600) and the point (editing point) of the voice message to be modified from which erasing of the voice message is to be started (block 601). The second editing algorithm EDIT2 then proceeds by verifying whether, in the sector containing the portion of the voice message that is to be erased, there are also present other portions of the voice message that are not to be erased (portions not to be erased). If the second editing algorithm EDIT2 finds that portions not to be erased are present, it shifts them into the sector reserved for this purpose ("swap" sector) (block 602). Shifting of the portions not to be erased into the "swap" sector is carried out, one block 3a at a time, and requires updating both of the list FBL and of the table MAT. In this way, consistency of the list FBL and the table MAT with the content of the first memory area 3 of the memory device 2 is maintained in the case where the electronic device 1 were to turn off abruptly.

Once the shifting step has been completed, the second editing algorithm EDIT2 executes the erasing algorithm DEL (block 603).

In addition, there exists the possibility that, on account of interruption of supply of the electronic device 1, the latter does not succeed in terminating correctly the algorithm that it was executing at that moment. This may lead, inside the memory device 2, to a misalignment between the list FBL, the table MAT, and the voice messages memorized in the first memory area 3 of the memory device itself. In greater detail, the following two situations may arise:

there exist in the list FBL one or more blocks 3a with status code '11;' this corresponds to a turning-off of the electronic device 1 during execution of the erasing algorithm DEL or the editing algorithms EDIT1 or EDIT2;

there exist in the list FBL one or more blocks 3a with status code '10' which are not associated to any voice message; this corresponds to a turning-off of the electronic device 1 during execution of the recording algorithm REC, or erasing algorithm DEL, or editing algorithms EDIT1 or EDIT2.

In both cases, there is the presence of blocks 3a that are occupied by data not belonging to any voice message memorized in the first memory area 3. This misalignment between the list FBL, the table MAT, and the voice message memorized in the first memory area 3 does not produce damages visible to the user in so far as, thanks to the way in which the algorithms previously described have been implemented, it does not adversely affect their execution, but does not enable a proper and efficient use of the memory device 2. In order to overcome such a drawback, the control unit 8 executes a memory-reorganization algorithm (known as "garbage-collector algorithm"), represented in the flowchart of FIG. 7. In detail, the garbage-collector algorithm carries out comparisons between the list FBL and the table MAT in order to identify possible misalignments between them. If the garbage-collector algorithm finds that there are misalignments between the list FBL and the table MAT, it eliminates these misalignments also carrying out the necessary erasing operations (blocks 700 and 701).

The garbage-corrector algorithm also reorganizes the table MAT in order to prevent a possible overflow thereof. In particular, the garbage-collector algorithm runs through the table MAT in sequence, eliminating therefrom the main vectors HEAD_MSG and secondary vectors NEXT_INFO associated to voice messages that have been previously erased (block 702). In order to update the list FBL and the table MAT appropriately, the garbage-collector algorithm uses a memory sector available inside the second memory area 4, in which the updated list FBL and the update table MAT can be memorized (block 703). An identification bit at the start of this sector signals that the updated list FBL and the update table MAT are contained therein. At the end of updating of the list FBL and the table MAT, the sector containing the non-updated list FBL and the non-updated table MAT is erased (block 704).

The garbage-collector algorithm is executed by the control unit 8 in the periods when the electronic device 1 is awaiting a new command from the user. As soon as a new command arrives, the control unit 8 appropriately interrupts the garbage-collector algorithm. It should moreover be emphasized that, in the case where the table MAT is close to its storage-capacity limit (a limit which is estimated by evaluating the percentage of memory space used by the table MAT and the amount of memory occupied by the voice messages), the garbage-collector algorithm cannot be interrupted. In this case, the user must wait for the garbage-collector algorithm to terminate before he can send a new command to the electronic device 1.

The control unit 8 executes the garbage-collector algorithm also when, no further blocks 3a are found available for memorizing new voice messages when the list FBL is run through. In this case, the garbage-collector algorithm is used for "validating" the "first memory area full" situation. In fact, it may happen that, even if no further free blocks 3a are present in the first memory area 3, on account of abrupt turning-off of the electronic device 1 there are even so blocks 3a present containing voice data no longer associated to any voice message present in the first memory area 3 itself. In this case, the garbage-collector algorithm erases these blocks 3a to obtain memory area available for memorizing new voice messages.

The advantages that may be obtained with the voice message managing method that has been described are illustrated in what follows. In the first place, the voice message managing method according to the present invention enables a more efficient implementation of the functions of partial editing and erasing of the messages, as compared to known methods. These two functions are increasingly important, especially in applications that enable recording and playing of voice messages of long duration (up to one hour), such as in the case of dictation and editing or revision of a letter or article.

In addition, the voice message managing method according to the present invention is more flexible than known methods, in so far as it unties, both logically and physically, memorizing of voice messages from memorizing of the information regarding the voice messages themselves. It is thus possible to add a new voice message to a voice message already recorded, leaving the latter unaltered, it being only necessary to modify the list FBL and the table MAT. This would be impossible to achieve if an approach were adopted in which the information regarding the voice message is entered in the voice message itself.

Furthermore, memorizing of the status of each block makes it possible to optimize, and in particular to reduce to the minimum only when it is indispensable, the operations of erasing of the first memory area 3 and second memory area 4, which can be erased only by sectors, at the same time increasing the speed of the electronic device 1 and reducing the stress associated to the erasing operations.

In addition, the fact of indicating as unusable, by means of the status code '01,' the blocks 3a of the first memory area 3 (which occupies approximately 98% of the area of the memory device 2) that present incorrect operation, enables use of the memory device 2 even when the latter has defective sectors. This proves very convenient, above all when the memory device 2 is of large size.

Finally, it is clear that numerous variations and modifications may be made to the method described and illustrated herein, all falling within the inventive idea, as defined in the attached claims.

What is claimed is:

1. A voice message managing method for a voice data electronic device, said electronic device including a memory device having a first memory area and a second memory area distinct from one another, wherein the first memory area includes plural groups each including plural blocks of memory cells, the method comprising:

a) memorizing in said first memory area a plurality of voice messages, each formed by a plurality of message portions;

b) memorizing in said second memory area information regarding said plurality of voice messages;

initializing said memory device, identifying conditions of proper operation and malfunctioning of said blocks;

storing in the list information on a status of each of said blocks regarding said conditions of proper operation and malfunctioning; and defining a table for memorizing of data regarding said voice messages and addresses of separate sequences of blocks in which each of said voice messages is memorized; wherein said step b) comprises the steps of:

b1) memorizing said list in a first memory sub-area of said second memory area; and b2) memorizing said table in a second memory sub-area of said second memory area.

2. The method according to claim 1, wherein said step a) comprises the step of:

memorizing in each block a respective one of the message portions, in the form of a plurality of digitized voice data, said message portions of one of the voice messages being memorized in non-contiguous sequences of said blocks.

3. The method according to claim 1 wherein said information on the status of said blocks is coded by means of a two-bit status code.

4. The method according to claim 1 wherein said step a) comprises the steps of:

detecting the presence of a first one of said blocks available in said first memory area;

updating, in said list, a status code associated with said first block;

memorizing a first portion of a first one of said voice messages in said first block;

detecting a condition of continuation of said first voice message;

detecting the presence of a second one of said blocks available in said first memory area;

memorizing a second portion of the first voice message in the second block;

verifying whether said second block is contiguous to said first block;

in response to verifying that the second block is not contiguous to the first block, appropriately updating said table; and detecting the presence of additional ones of said block available in said first memory area, memorizing respectively additional portion of the first voice messages in the additional ones of said blocks, verifying whether succeeding ones of the additional blocks are contiguous with preceding ones of the blocks, and appropriately updating the table until a condition of conclusion of said voice message is detected.

5. The method according to claim 4 wherein said status code includes a plurality of bits and said step a2) comprises modifying one of the bits of said status code associated to aid first block.

6. The method according to claim 4 wherein said steps a1) and a5) each comprise the steps of detecting a condition of filling of said first memory area, and of interrupting said step a) in the case of a memory-area-full condition; and said step a4) comprises the steps of appropriately updating said table in the absence of said condition of continuation, and of interrupting said step a).

7. The method according to claim 4, further comprising a step of entering a new voice message into a previously memorized message, including the steps of:

acquiring a datum identifying said previously memorized voice message;

acquiring a point of entry of said new voice message into said previously memorized voice message; and repeating said steps a1) to a8).

8. The method according to claim 1, further comprising:

determining that a selected block of a selected group of the first memory area is to be erased;

memorizing in the list in said second memory area an indication that the selected block is to be erased;

postponing erasing of the selected block until there are indications in the list that a plurality of blocks, including the selected block, of the selected group are to be erased; and erasing in a single operation the selected group in response to determining that there are indications in the list that a plurality of blocks, including the selected block, of the selected group are to be erased.

9. A voice message managing method for a voice data electronic device, said electronic device including a memory device having a first memory area and a second memory area distinct from one another, the method comprising:

a) memorizing in said first memory area a plurality of voice messages, each formed by a plurality of message portions;

b) memorizing in said second memory area information regarding said plurality of voice messages;

organizing said first memory area as a sequence of blocks;

initializing said memory device, identifying conditions of proper operation and malfunctioning of said blocks;

defining a list containing information on a status of each of said blocks regarding said conditions of proper operation and malfunctioning; and defining a table for memorizing of data regarding said voice messages and addresses of separate sequences of blocks in which each of said voice messages is memorized; wherein said step b) comprises the steps of:

b1) memorizing said list in a first memory sub-area of said second memory area; and b2) memorizing said table in a second memory sub-area of said second memory area; wherein said table comprises:

a plurality of first vectors, each first vector being associated with a respective one of said voice messages and comprising a plurality of successive fields containing the data regarding said respective voice message and addresses for a first sequence of blocks containing said respective voice message; and a plurality of second vectors, each second vector being associated with a respective one of said first vectors, and each second vector comprising a plurality of successive fields containing addresses for successive sequences of blocks in which said respective voice message is contained.

10. The method according to claim 9, further comprising the step of playing a voice message, said step of playing a voice message comprising the steps of:

c1) acquiring an identification datum identifying a voice message to be played;

c2) reading from said table a first vector of said voice message to be played associated with said identification datum;

c3) acquiring from said first vector a first address of a memory location in which a first sequence of contiguous blocks containing said voice message to be played starts, and acquiring from said first vector a second address of a memory location in which said first sequence of contiguous blocks terminates;

c4) playing said first sequence of contiguous blocks;

c5) reading said table to verify whether a second vector associated to said first vector is present;

c6) acquiring from said second vector a first address of a memory location in which a second sequence of contiguous blocks containing said voice message to be played starts, and acquiring from said second vector a second address of a memory location in which said second sequence of contiguous blocks terminates; and c7) repeating said steps c4) to c6) until an end of said voice message to be played.

11. The method according to claim 9, further comprising a step of erasing a voice message, said step of erasing a voice message comprising the steps of:

d1) acquiring an identification datum identifying a voice message to be erased;

d2) reading in said table a first vector of said voice message to be erased associated to said identification datum;

d3) acquiring from said first vector an address of a memory sector containing said voice message to be erased;

d4) verifying whether other voice messages are present in said memory sector;

d5) memorizing said other voice messages in blocks of an available memory sector available, updating said list and said table;

d6) updating, in said list and said table, status codes associated with blocks containing said message to be erased;

d7) deleting said memory sector containing said voice message to be erased;

d8) reading said table to verify whether a second vector associated with said first vector is present;

d9) repeating said steps d3) to d8) until an end of said voice message to be erased;

d10) updating, in said list, status codes associated with said respective blocks containing said message to be deleted.

12. The method according to claim 11 wherein said step d5) comprises modifying one of the bits of the status codes associated to said blocks of said other voice messages; in that said step d6) comprises modifying one of the bits of the status codes associated to blocks containing said message to be erased; and in that said step d10) comprises modifying both the bits of said status codes associated to said blocks containing said message to be erased.

13. The method according to claim 11, further comprising a step of erasing portions of previously memorized message, including the steps of:

f1) acquiring an identification datum identifying said previously memorized voice message;

f2) acquiring a point of start of erasing of said previously memorized voice message;

f3) verifying whether other portions to be kept of said previously memorized voice message are present;

f4) memorizing said portions of said previously memorized voice message in blocks of an available memory sector, updating, in said list, status codes associated with said blocks of said available memory sector, and updating said table; and f5) repeating said steps d2) to dl 0).

14. The method according to claim 9 wherein, associated with each first vector is available identifying a status of validity of a respective one of said voice messages.

15. The method according to claim 9, further comprising a step of memory-reorganization (garbage collection).

16. The method according to claim 15 wherein said step of memory reorganization comprises the steps of:

g1) comparing said list and said table to verify whether misalignments are present;

g2) in the presence of misalignments, updating said list and said table so as to eliminate said misalignments;

g3) sequentially reading said table and erasing first vectors and second vectors associated with previously erased voice messages; and g4) memorizing, in an available memory sector, said updated list and said updated table.

17. A voice message managing method for a voice data electronic device, the method comprising:

storing a plurality of voice messages in a first memory area, each of the voice messages including a plurality of voice message portions that are stored in a plurality of memory blocks of the first memory area, respectively;

determining which of the voice message portions is stored in each of the memory blocks;

storing a message allocation table in a second memory area, the message allocation table including information characterizing the voice messages and addresses of separate sequences of blocks in which each voice message is stored in the first memory area;

identifying conditions of proper operation and malfunctioning of the blocks of the first memory area;

defining a list containing information on a status of each of the blocks regarding the conditions of proper operation and malfunctioning; and memorizing the list in a first memory sub-area of the second memory area, wherein the message allocation table is stored in a second memory sub-area of the second memory area.

18. The method according to claim 17 wherein storing the message allocation table includes:

detecting the presence of a first one of the blocks available in the first memory area;

updating, in the list, a status code associated with the first block;

memorizing a first portion of a first one of the voice messages in the first block;

detecting a condition of continuation of the first voice message;

detecting the presence of a second one of the blocks available in the first memory area;

verifying whether the second block is contiguous to the first block;

if the second block is not contiguous with the first block, then appropriately updating the table; and storing a second portion of the first voice message in the second block regardless of whether the second block is contiguous to the first block.

19. A voice message managing method for a voice data electronic device, the method comprising:

storing a plurality of voice messages in a first memory area, each of the voice messages including a plurality of voice message portions that are stored in a plurality of memory blocks of the first memory area, respectively;

determining which of the voice message portions is stored in each of the memory blocks;

storing a message allocation table in a second memory area, the message allocation table including information characterizing the voice messages and addresses of separate sequences of blocks in which each voice message is stored in the first memory area, wherein the message allocation table comprises:

a plurality of first vectors, each first vector being associated with a respective one of the voice messages and comprising a plurality of successive fields containing the data regarding the respective voice message and addresses for a first sequence of blocks containing the respective voice message; and a plurality of second vectors, each second vector being associated with a respective one of the first vectors, and each second vector comprising a plurality of successive fields containing addresses for successive sequences of blocks in which the respective voice message is contained.

20. The method according to claim 19, further comprising playing a voice message by:

acquiring an identification datum identifying a voice message to be played;

reading from the message allocation table a first vector of the voice message to be played associated with the identification datum;

acquiring from the first vector a first address of a memory location in which a first sequence of contiguous blocks containing the voice message to be played starts, and acquiring from the first vector a second address of a memory location in which the first sequence of contiguous blocks terminates;

playing the first sequence of contiguous blocks;

reading the message allocation table to verify whether a second vector associated with the first vector is present; and acquiring from the second vector a first address of a memory location in which a second sequence of contiguous blocks containing the voice message to be played starts, and acquiring from the second vector a second address of a memory location in which the second sequence of contiguous blocks terminates.

21. The method according to claim 19, further comprising erasing a voice message by:

acquiring an identification datum identifying a voice message to be erased;

reading in the message allocation table a first vector of the voice message to be erased associated with the identification datum;

acquiring from the first vector an address of a memory sector containing the voice message to be erased;

verifying whether other voice messages are present in the memory sector;

memorizing the other voice messages in blocks of an available memory sector available;

deleting the memory sector containing the voice message to be erased; and reading the message allocation table to verify whether a second vector associated with the first vector is present.

* * * * *

UNITED STATES PATENT AND TRADEMARK OFFICE
CERTIFICATE OF CORRECTION

PATENT NO.    : 6,804,685 B2
DATED         : October 12, 2004
INVENTOR(S)   : Besana et al.

It is certified that error appears in the above-identified patent and that said Letters Patent is hereby corrected as shown below:

Column 12,
Line 39, "f5) repeating said steps d2) to dl 0)." should read as -- 5) repeating said steps d2) to dl10). --
Line 41, "with each first vector is available identifying" should read as -- with each first vector is a value identifying --.

Signed and Sealed this

Twenty-first Day of June, 2005

JON W. DUDAS
*Director of the United States Patent and Trademark Office*